(12) United States Patent
Baumgarte

(10) Patent No.: US 9,276,544 B2
(45) Date of Patent: Mar. 1, 2016

(54) DYNAMIC RANGE CONTROL GAIN ENCODING

(71) Applicant: Apple Inc., Cupertino, CA (US)

(72) Inventor: Frank M. Baumgarte, Sunnyvale, CA (US)

(73) Assignee: Apple Inc., Cupertino, CA (US)

(*) Notice: Subject to any disclaimer, the term of this patent is extended or adjusted under 35 U.S.C. 154(b) by 98 days.

(21) Appl. No.: 14/280,423

(22) Filed: May 16, 2014

(65) Prior Publication Data

US 2015/0162884 A1    Jun. 11, 2015

Related U.S. Application Data

(60) Provisional application No. 61/914,288, filed on Dec. 10, 2013.

(51) Int. Cl.
| | |
|---|---|
| *H03G 3/00* | (2006.01) |
| *H03G 3/20* | (2006.01) |
| *H03G 11/00* | (2006.01) |
| *H03G 3/32* | (2006.01) |
| *H03G 7/00* | (2006.01) |

(52) U.S. Cl.
CPC .............. *H03G 3/20* (2013.01); *H03G 3/001* (2013.01); *H03G 3/32* (2013.01); *H03G 7/007* (2013.01); *H03G 11/00* (2013.01)

(58) Field of Classification Search
None
See application file for complete search history.

(56) References Cited

U.S. PATENT DOCUMENTS

| | | | |
|---|---|---|---|
| 6,782,366 B1 | 8/2004 | Huang et al. | |
| 8,014,534 B2 * | 9/2011 | Henn | G10L 19/008 381/106 |
| 8,085,941 B2 | 12/2011 | Taenzer | |
| 2003/0035549 A1 * | 2/2003 | Bizjak | H03G 3/3089 381/56 |
| 2008/0120114 A1 * | 5/2008 | Ojanpera | G10L 19/173 704/278 |
| 2010/0083344 A1 | 4/2010 | Schildbach | |
| 2010/0250258 A1 | 9/2010 | Smithers et al. | |
| 2010/0310085 A1 | 12/2010 | Hyen-O et al. | |
| 2011/0085677 A1 | 4/2011 | Walsh et al. | |

(Continued)

FOREIGN PATENT DOCUMENTS

| | | |
|---|---|---|
| WO | WO-2013/041875 A2 | 3/2013 |
| WO | WO-2013/068637 A1 | 5/2013 |
| WO | WO-2013/173080 | 11/2013 |

OTHER PUBLICATIONS

Fraunhofer IIS. "White Paper HE-AAC Metadata for Digital Broadcasting." (Sep. 2011). 16 pages.

(Continued)

*Primary Examiner* — Muhammad N Edun
(74) *Attorney, Agent, or Firm* — Blakely, Sokoloff, Taylor & Zafman LLP

(57) ABSTRACT

A system and method is provided for converting Dynamic Range Control/Compression (DRC) gain values into a spline representation that is compatible with the current standards. The system and method may: 1) minimize the bitrate for encoding and/or 2) minimize the approximation error between reference gain and interpolation values. A strategy for bitrate minimization may be the reduction of the number of spline nodes since gain and slope information must be transmitted for each node. Accordingly, an efficient heuristics based approach is provided that reduces the number of spline nodes needed to represent a series of DRC gain values using interpolation while accounting for overshoots and other inaccuracies.

25 Claims, 9 Drawing Sheets

(56) References Cited

U.S. PATENT DOCUMENTS

2012/0224611 A1   9/2012   Baheti et al.
2012/0310654 A1   12/2012  Riedmiller et al.
2013/0156229 A1   6/2013   Riedl

OTHER PUBLICATIONS

ATSC, "A/53:ATSC Digital Television Standard, Parts 1-6, 2007." Advanced Television Systems Committee, Inc. Washington, D.C. (Jan. 3, 2007). 136 pages.

ATSC, "ATSC Recommended Practice: Techniques for Establishing and Maintaining Audio Loudness for Digital Television", Document A/85:2011, pp. 1-76. Advanced Television Systems Committee, Inc. Washington, D.C. (Jul. 25, 2011). 76 pages.

ATSC, "ATSC Standard: Digital Audio Compression (AC-3, E-AC-3)", *Advanced Television Systems Committee.* Doc. A/52: 2012. Washington, D.C. (Dec. 17, 2012). 270 pages.

Dolby Laboratories, Inc., "Dolby Metadata Guide", Issue 3. S05/14660/16797 (2005). 28 pages.

Ebu-Uer, "EBU Recommendation R 128 "Loudness Normalisation and Permitted Maximum Level of Audio Signals"", Geneva, Switzerland (Aug. 2011). 5 pages.

ETSI, "Digital Video Broadcasting (DVB); Specification for the Use of Video and Audio Coding in Broadcasting Applications Based on the MPEG-2 Transport Stream.", *ETSI* TS 101 154v1.11.1. European Telecommunication Standards Institute; European Broadcasting Union (Nov. 2012). 195 pages.

Giannoulis, D., "A Design of a Digital, Parameter-automated Dynamic Range Compressor." MSC Project Report. Queen Mary University of London (Aug. 26, 2010). 92 pages.

Massberg, M. "Investigation in Dynamic Range Compression." MSC Project Report. Queen Mary University of London (Aug. 25, 2009). 66 pages.

ISO/IEC, "Coding of Moving Pictures and Audio." *ISO/IEC 13818-7, International Standard* (2003). 206 pages.

ISO/IEC, "Information Technology-Coding of Audio-Visual Objects-Part 3: Audio." *ISO/IEC* 14496-3, Subpart 4 International Standard (2009). 150 pages.

ISO/IEC, "ISO/IEC 14496-3:200X(E)." Fourth Edition, Switzerland (2009). 150 pages.

ISO/MPEG, "On ISO/IEC 14496-12 Technologies under Consideration: Enhanced Audio Support." Contribution M29150, 104th MPEG meeting, Incheon, Korea (Apr. 2013). 14 pages.

ISO/MPEG, "Enhanced Metadata for Dynamic Range Compression." ISO/IEC JTC1/SC29WG11 MPEG2013/M28901. Incheon, Korea (Apr. 2013). 10 pages.

ISO/MPEG, "Information Technology-MPEG Audio Technologies-Part 1: MPEG Surround." *ISO/IEC* FDIS 23003-1 (2006). 294 pages.

ISO/MPEG, "Information Technology-MPEG Audio Technologies-Part 2: Spatial Audio Object Coding." *ISO/IEC* FDIS 230003-2 (2010). 139 pages.

ISO/MPEG, "Timeline and Requirements for MPEG-H 3D Audio Version 1." ISO/IEC JTC1/SC29/WG11/N13855. Vienna, Austria (Aug. 2013).

ISO/MPEG, "Proposed Revision of Audio Aspects of WD: Addition of Sample Aspect Ratio and Further Audio Code-Points." Vienna, Austria (Jul. 2013). 7 pages.

ISO/MPEG, "Information Technology-MPEG Audio Technologies-Part 3: Unified Speech and Audio Coding." *ISO/IEC* FDIS 23003-3:2011 (2011). 286 pages.

International Telecommunications Union, ITU-R Radiocommunication Sector of ITU, "Algorithms to Measure Audio Programme Loudness and True-Peak Audio Level." Recommendation ITU-R BS.1770-3., Geneva, Switzerland (Aug. 2012). 24 pages.

Wang, et al., "Modified Discrete Cosine Transform-Its Implications for Audio Coding and Error Concealment." *JAES*, vol. 51, No. 1/2 (Jan./Feb. 2003). 10 pages.

ISO/IEC. "Working Draft for Aspect Ratio Amendment to CICP." ISO/IEC/JTC1/SC29/WG11/N13595. Incheon, Korea (Apr. 2013). 6 pages.

ISO/MPEG. "Improved Audio Support in the ISO Base Media File Format." ISO/IEC JTC1/SC29/WG11, MPEG2013/m31470. Geneva, Switzerland (Oct. 23, 2013). 12 pages.

Baumgarte, et al. "Working Draft on Dynamic Range Control." ISO/IEC JTC1/SC29/WG11 MPEG2013/N14067. Geneva, Switzerland (Nov. 2013). 32 pages.

International Search Report and Written Opinion of the ISA in PCT/US2014/065295 dated Feb. 11, 2015. 10 pages.

\* cited by examiner

DYNAMIC RANGE CONTROL GAIN ENCODING

RELATED MATTERS

This application claims the benefit of the earlier filing date of U.S. provisional application No. 61/914,288, filed Dec. 10, 2013.

FIELD

An embodiment of the invention generally relates to a system and method for selecting spline nodes in a spline representation of Dynamic Range Control (DRC) gain values for an audio signal. Other embodiments are also described.

BACKGROUND

Dynamic Range Control/Compression (DRC) reduces the dynamic range of an audio signal by some amount by (1) making soft parts in the audio signal louder; (2) making loud parts in the audio signal softer; or (3) both making soft parts louder and making loud parts softer. A reduced dynamic range may be desirable in several situations, including for audio playback systems that can only reproduce a small dynamic range while maintaining low distortions, listening environments with distracting sounds, and in situations where the listener does not want to distract others. DRC may also be applied to avoid clipping, i.e., exceeding the full scale of the audio format, for instance when audio samples are represented as fixed-point numbers. Another application of time-varying gain is the generation of fade-in and fade-out of the audio content at the beginning and end of a song for so-called gap-less content.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

In one embodiment, a system and method may be used for encoding an audio signal corresponding to a piece of sound program content. In particular, the system and method may convert Dynamic Range Control/Compression (DRC) gain values into a spline representation that is compatible with the current standards (e.g., International Organization for Standardization (ISO) and/or Moving Picture Experts Group (MPEG) standards and proposals). In one embodiment, the system and method may: 1) minimize the bitrate for encoding and/or 2) minimize the approximation error between reference gain and interpolation values. In one embodiment, a strategy for bitrate minimization may be the reduction of the number of spline nodes since gain and slope information must be transmitted for each node. Accordingly, by reducing the number of spline nodes, the amount of data transmitted or needed to be stored will also decrease. However, if the node density is not sufficient to accurately represent the gain curve, the approximation error will increase.

To solve this optimization, a brute-force method may be used that evaluates all possible combinations of DRC spline nodes for an audio signal and picks the best configuration. However, this method may be extremely complex due to the huge number of possible combinations. Hence, a technically more reasonable approach may be one based on heuristics that is able to achieve good results with comparatively small complexity. Such a heuristic method is presented herein.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Dynamic Range Control (DRC) of audio signals is currently subject to standardization by International Organization for Standardization (ISO) and/or Moving Picture Experts Group (MPEG). At the current stage of standardization, time-varying DRC gain values are encoded for transmission along with a corresponding audio signal. Since MPEG only specifies the bitstream format and decoding algorithm, there is flexibility in encoder design and optimization. An algorithm is provided herein for the conversion of DRC gain values into a spline representation for encoding that is compatible with the current MPEG proposal.

The current MPEG working draft includes a description of the DRC gain bitstream syntax, so that time-varying gains can efficiently be transmitted to a receiver. The receiver can then apply the time-varying gains when appropriate. The decoder for the encoded gain sequences is fully specified in the draft and is based on spline interpolation. However, the encoder is only required to produce a valid bitstream, but is otherwise unconstrained.

The time-varying DRC gains may be generated by a dynamic range compressor. For simplicity, the time-varying DRC gains at the output of the dynamic range compressor may be given in a linear pulse-code modulation (LPCM) format at the audio sample rate and the gain samples are given in decibels (dB). The audio signal may be processed frame-by-frame, where each frame consists of a constant number of audio samples.

Figure 1:
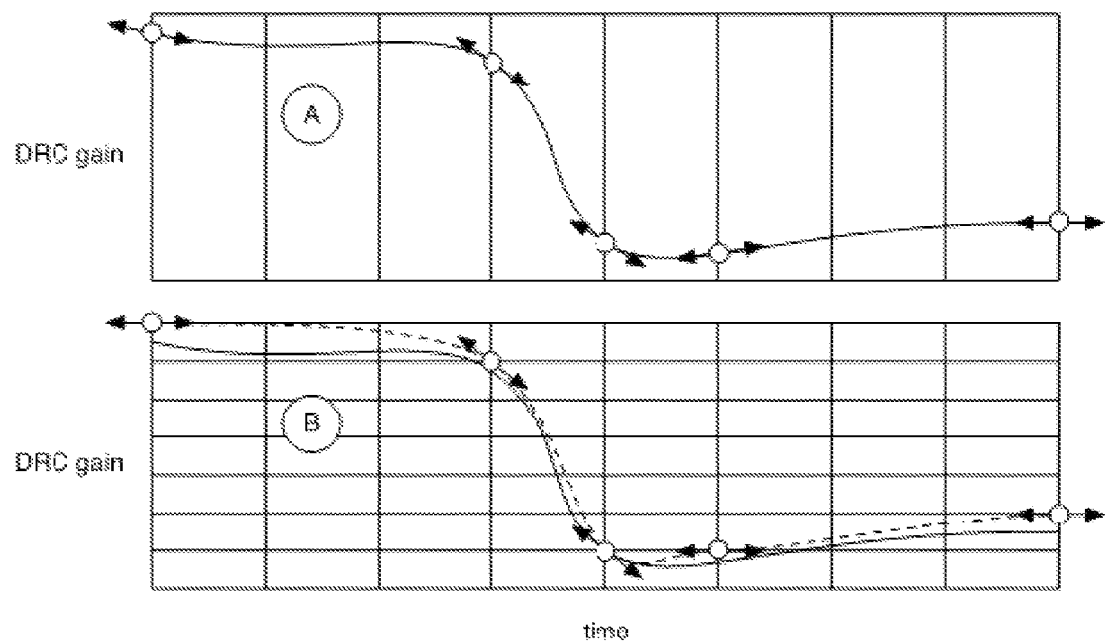
FIG. 1 shows Dynamic Range Control/Compression (DRC) gain representation using splines according to one embodiment.

FIG. 1 shows an example of a DRC representation using splines. The upper graph includes the gain (solid line), where circles represent discrete time instances selected by the gain encoder to place nodes for the spline interpolation. Each node has a slope steepness indicated by the arrows. The nodes can only be located on a uniform grid which is specified by the decoding algorithm.

The lower graph includes the same gain (solid line) and the interpolated gain (dashed line). The interpolation is based on quantized gain values and slopes. Hence, the nodes are located on cross points of the mesh and the slopes have slightly different values as specified by the decoding algorithm.

In one embodiment, the main goals of an efficient DRC gain encoder may be twofold: 1) minimize the bitrate for encoding and/or 2) minimize the approximation error between reference gain and interpolation values. In one embodiment, a strategy for bitrate minimization may be the reduction of the number of nodes since gain and slope information must be transmitted for each node. Accordingly, by reducing the number of spline nodes, the amount of data transmitted or needed to be stored will also decrease. However, if the node density is not sufficient to accurately represent the gain curve, the approximation error will increase.

A relevant measure of the approximation may be conceptually based on a perceptual difference. This means that a deviation of the reference gain curve is only significant if it can potentially cause an audible difference. As a guideline, the quantization step sizes for the time and gain coordinates have been designed to be smaller than critical values that would result in a just noticeable difference. Hence, deviations within half of the quantization step size are considered inaudible.

Intuitively, the gain encoder should allocate more nodes to areas with larger gain changes. If there is no gain change at all, just one node is sufficient to represent the gain for the whole frame. Due to the spline interpolation method, which is based on polynomials of orders up to three, the interpolated gain may result in unintended oscillations. These oscillations may be especially problematic when they lead to "overshoots" of the interpolated gain curve so that the audio signal would unintentionally be amplified. To avoid this problem, a gain encoder may be designed to monitor overshoots and similar artifacts of the spline interpolation and avoid these issues by modifying the encoding. The modifications may include a different placement of spline nodes and/or changes of slope steepness values.

To solve this optimization, a brute-force method may be used that evaluates all possible encodings and picks the best configuration. However, this method may be extremely complex due to the huge number of possible combinations. Hence, a technically more reasonable approach may be one based on heuristics that is able to achieve good results with comparatively small complexity. Such a heuristic method is presented below.

Optimized Spline Representation

In the following, a system and method for DRC gain representation using splines is described. The system and method produce an optimized spline representation in the sense that they aim to minimize bit rate and approximation error. The method may consist of a number of operations that work well in the order they appear. However, in other embodiments the order of the operation may be changed without producing significantly inferior results. In some embodiments, the operations of the method may be performed in partially overlapping time periods.

The spline representation may be completely defined when all node coordinates are given along with their corresponding slope steepness. The two dimensional node coordinates may be specified by a time value and a gain value. Values described herein may be quantized according to one or more techniques. In some embodiments, a single spline segment between two nodes may depend on the time/gain coordinates and slopes at the two nodes.

Audio Encoding Device

Figure 8:
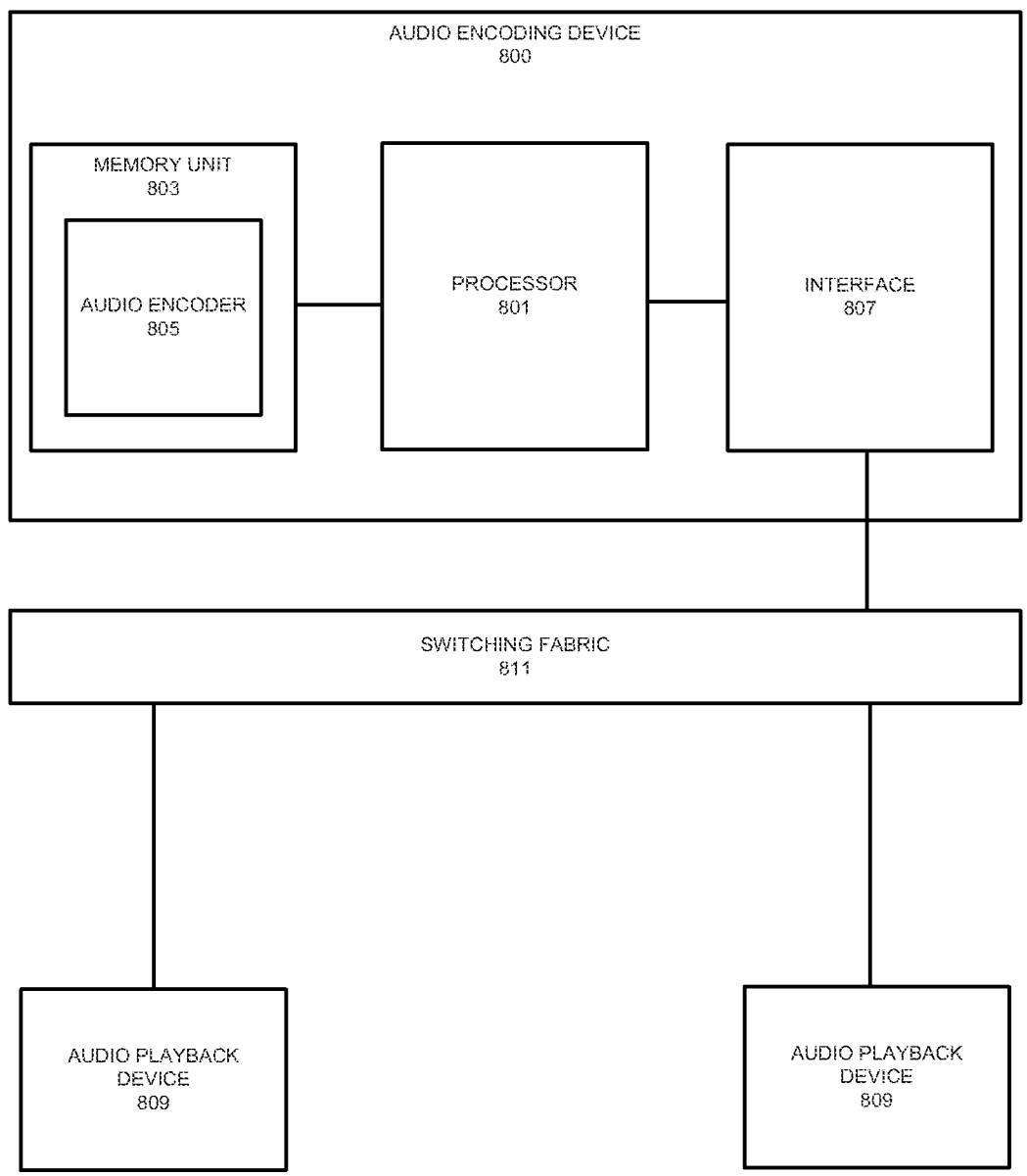
FIG. 8 shows a component diagram of an audio encoding device according to one embodiment.

FIG. 8 shows an audio encoding device 800 according to one embodiment. The audio encoding device 800 may be any device capable of performing one or more operations of the audio encoding method that will be described in greater detail below. For example, the audio encoding device 800 may be a desktop computer, a laptop computer, a tablet computer, a mobile device (e.g., a smartphone), a set-top box, a gaming device, or any other similar device that is capable of processing and encoding a piece of audio.

As shown in FIG. 8, the audio encoding device 800 may include a hardware processor 801 and/or a memory unit 803. The processor 801 and the memory unit 803 are generically used here to refer to any suitable combination of programmable data processing components and data storage that conduct the operations needed to implement the various functions and operations of the audio encoding device 800. The processor 801 may be an applications processor typically found in a smart phone, while the memory unit 803 may refer to microelectronic, non-volatile random access memory. An operating system may be stored in the memory unit 803 along with application programs specific to the various functions of the audio encoding device 800, which are to be run or executed by the processor 801 to perform the various functions of the audio encoding device 800. For example, an audio encoder 805 may be stored in the memory unit 803. As will be described in greater detail below, the audio encoder 805 may be used to encode a piece of sound program content represented by an audio signal.

In one embodiment, the audio encoding device 800 may include an interface 807 for communicating with one or more audio playback devices 809 or other devices (e.g., remote audio/video streaming services) over the switching fabric 811. The interface 807 may utilize wired mediums (e.g., conduit or wire) to communicate with the audio playback devices 809. In another embodiment, the interface 807 may communicate with the audio playback devices 809 through a wireless connection. For example, the interface 807 may utilize one or more wireless protocols and standards for communicating with the audio playback devices 809, including the IEEE 802.11 suite of standards, cellular Global System for Mobile Communications (GSM) standards, cellular Code Division Multiple Access (CDMA) standards, Long Term Evolution (LTE) standards, and/or Bluetooth standards.

In one embodiment, the switching fabric 811 includes a set of network components that facilitate communications between multiple devices. For example, the switching fabric 811 may be composed of one or more switches, routers, hubs, etc. These network components that comprise the switching fabric 811 may operate using both wired and wireless mediums as described above in relation to the interface 807.

Figure 9:
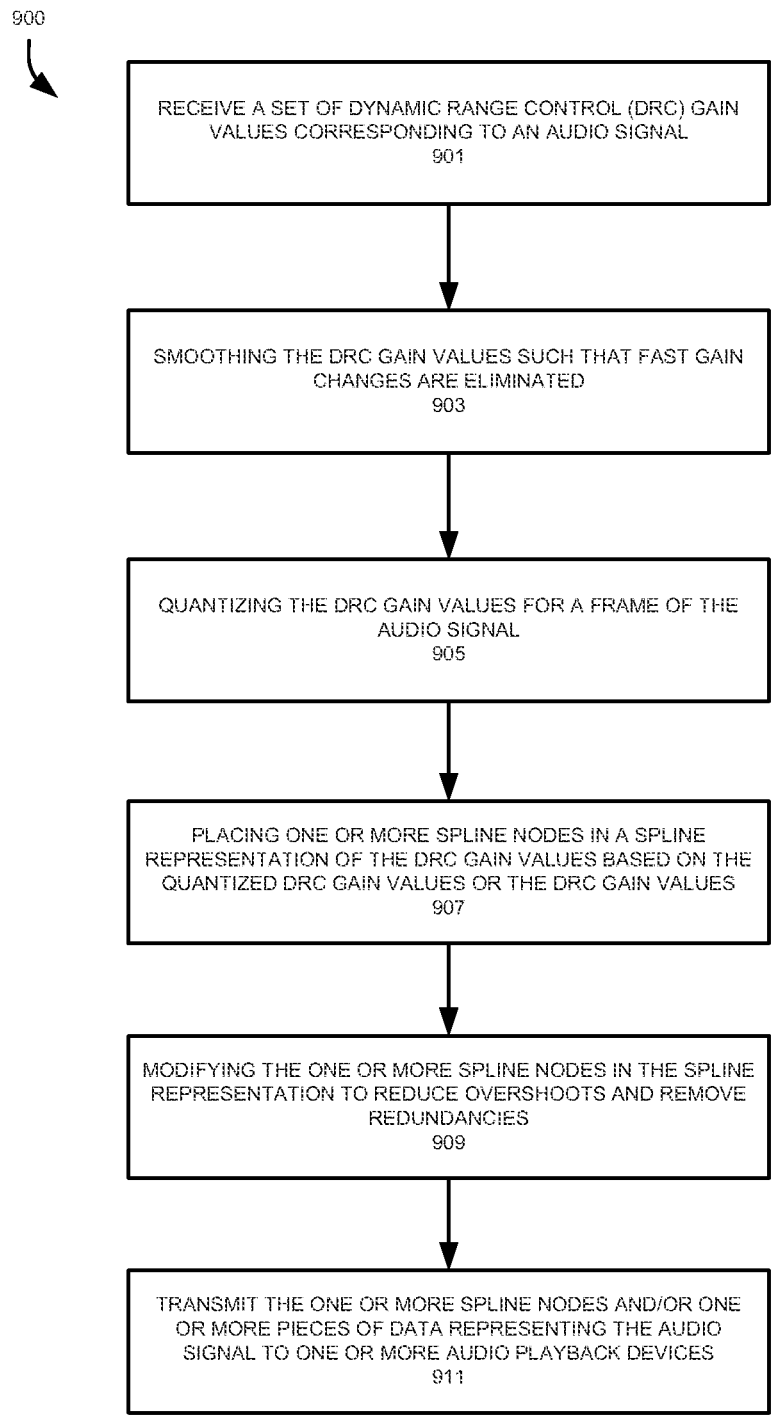
FIG. 9 shows a method for encoding an audio signal corresponding to a piece of sound program content according to one embodiment.

Turning now to FIG. 9, a method 900 for encoding an audio signal corresponding to a piece of sound program content (e.g., a musical composition or an audio track for a movie) will now be described. In one embodiment, the method 900 may encode the audio signal by selecting spline nodes for DRC gain values. In one embodiment, the method 900 may be performed by one or more components of the audio encoding device 800. For example, the audio encoder 805 may perform one or more operations of the method 900. In other embodiments, the method 900 may be performed by other components of the audio encoding device 800, including hardware circuitry integrated or otherwise associated with the audio encoding device 800. Each operation of the method 900 will be described below by way of example.

Preparation Steps

In one embodiment, the method 900 may commence at operation 901 with receipt of DRC gain values corresponding to an audio signal. For example, the DRC gain values may be extracted from the audio signal, which was received via the interface 807 from a remote device, or stored locally on the audio encoding device 800. The DRC gain values may be fed into a DRC gain encoder (e.g., the audio encoder 805) in an LPCM format, i.e., a uniformly sampled sequence of PCM values usually at the audio sample rate. The audio sample rate may be higher than the maximum rate at which spline nodes can occur. DRC gains may be processed frame-by-frame. The last gain value of the previous frame may be stored to be available for processing of the current frame. In one embodiment, at operation 903, the DRC gain values may be smoothed over time to eliminate very fast gain changes that can misguide the algorithm. These fast gain changes can be eliminated because they are irrelevant in terms of perception. Slope values may be computed based on the smoothed DRC gain.

Placing Initial Spline Nodes

Following optional smoothing, spline nodes may be calculated. In a first step, a number of spline nodes may be placed at certain locations for the current frame. The locations for the nodes are identified by evaluating gain changes and slopes.

In one embodiment, the smoothed DRC gain may be quantized at operation 905 and the smoothed quantized gain values may be used to select spline nodes at operation 907 as follows:

A spline node may be placed at a certain point in time (without quantization), if there is a change in the quantized DRC gain.
  If there is a period with identical quantized DRC gain values, a node is placed at the quantized value with the smallest quantization error.
  If there is no node assigned so far, a node is placed in the middle of the frame.

The node locations in time are now quantized and the gain values at the new time locations are quantized. If the quantization error is large in areas with a larger slope, new nodes may be inserted to reduce the approximation error.

Modifying Nodes

Figure 2:
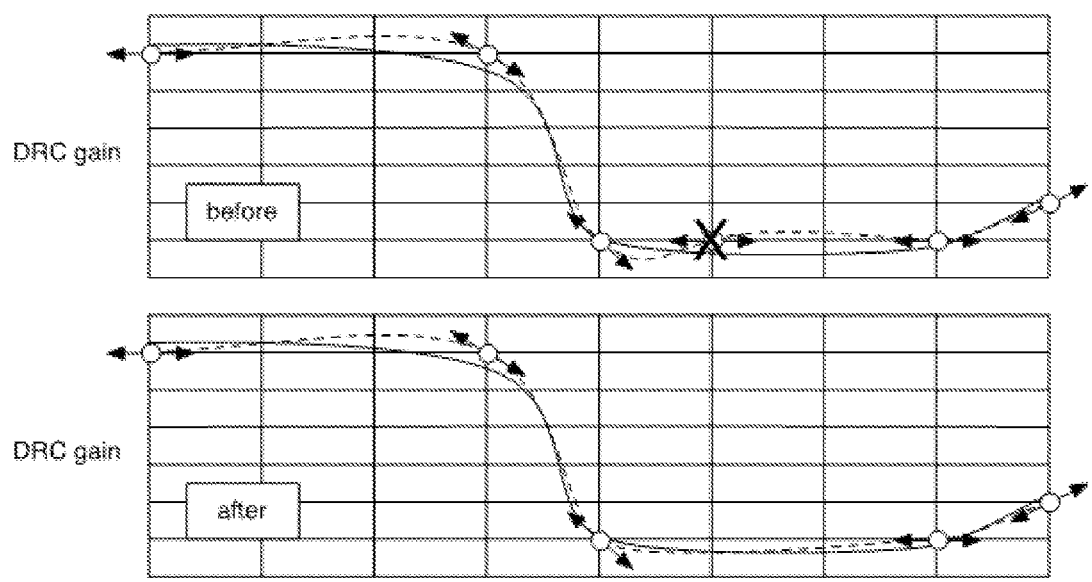
FIG. 2 shows spline modification by removing the middle node if three consecutive nodes have identical gain values according to one embodiment.
Figure 3:
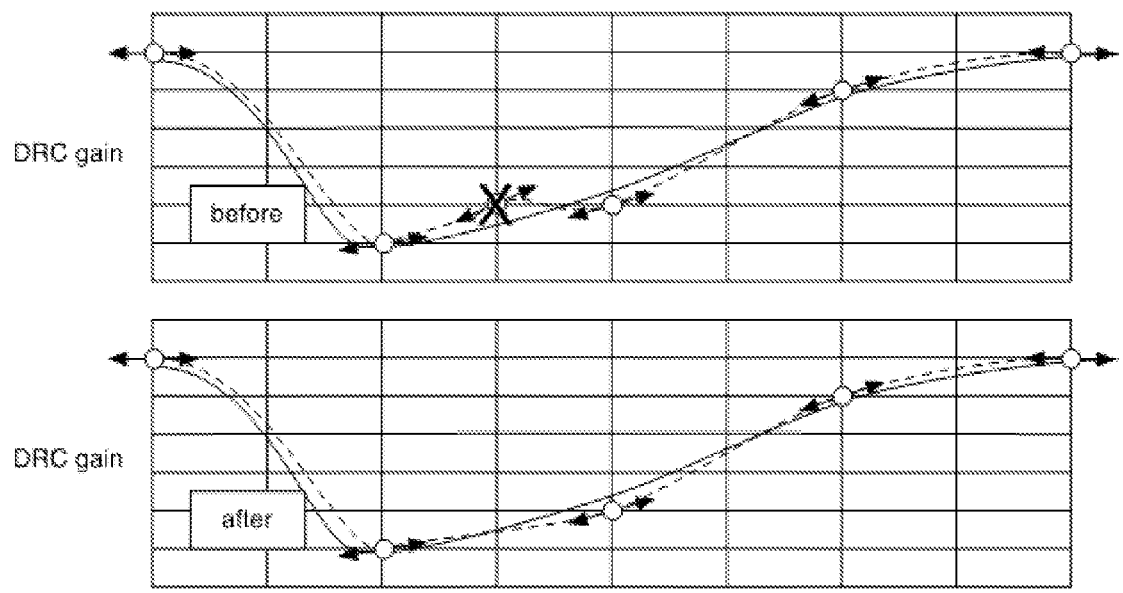
FIG. 3 shows spline modification by removing one middle node of four nodes if the two middle nodes have the same gain value and the four nodes are on an ascending or descending slope according to one embodiment.
Figure 4:
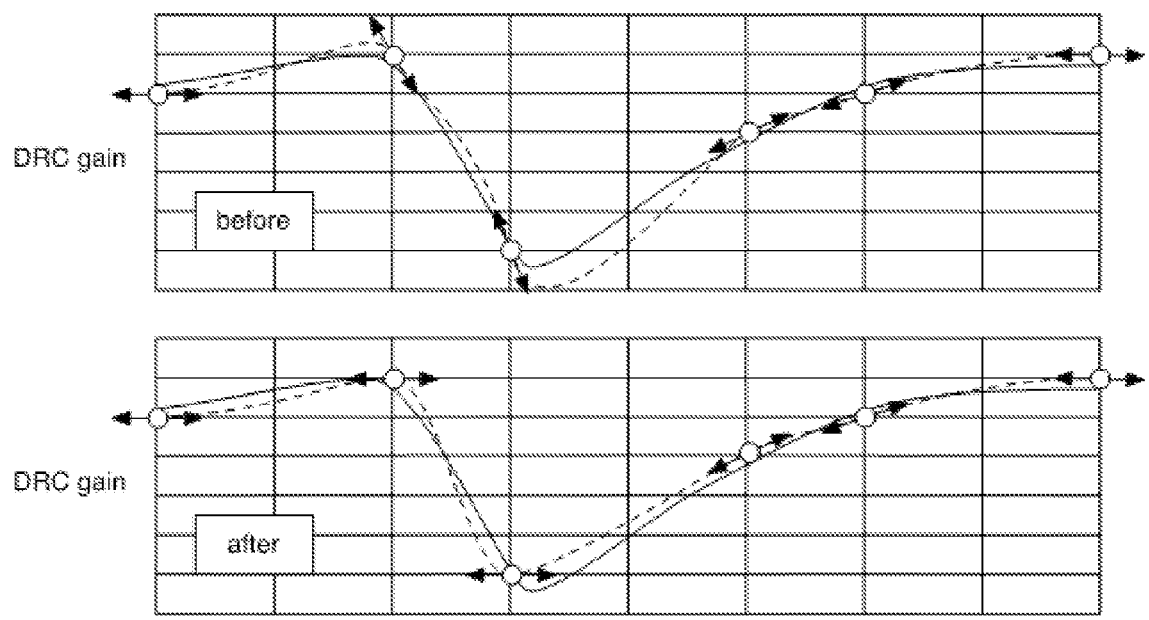
FIG. 4 shows spline modification by setting the slope steepness to zero for local maxima and minima of gain according to one embodiment.
Figure 5:
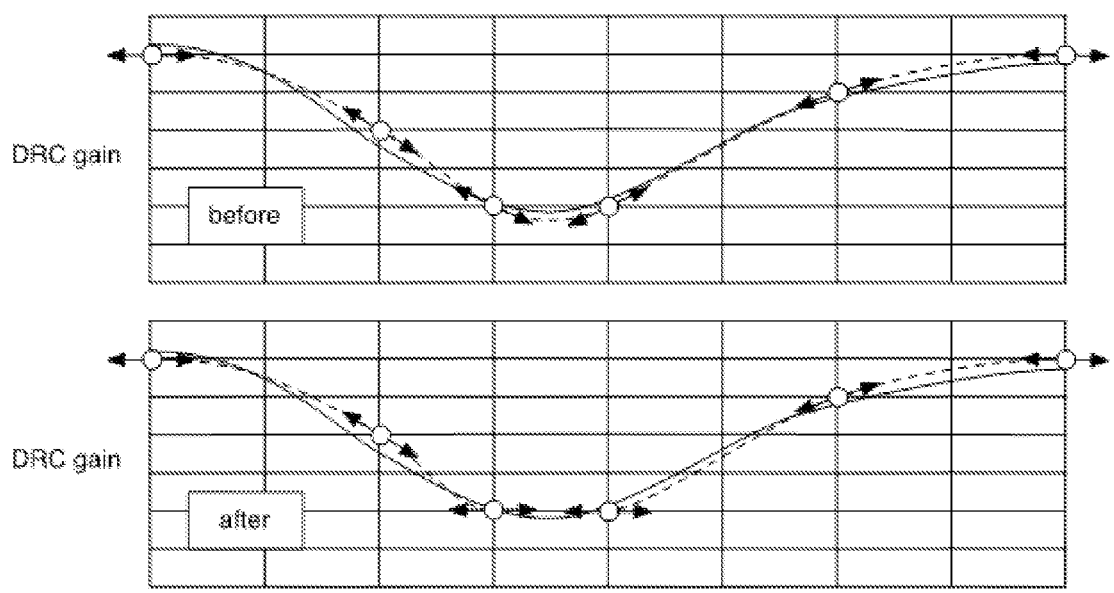
FIG. 5 shows spline modification by setting the slope steepness to zero if neighboring quantized gain values are the same according to one embodiment.
Figure 6:
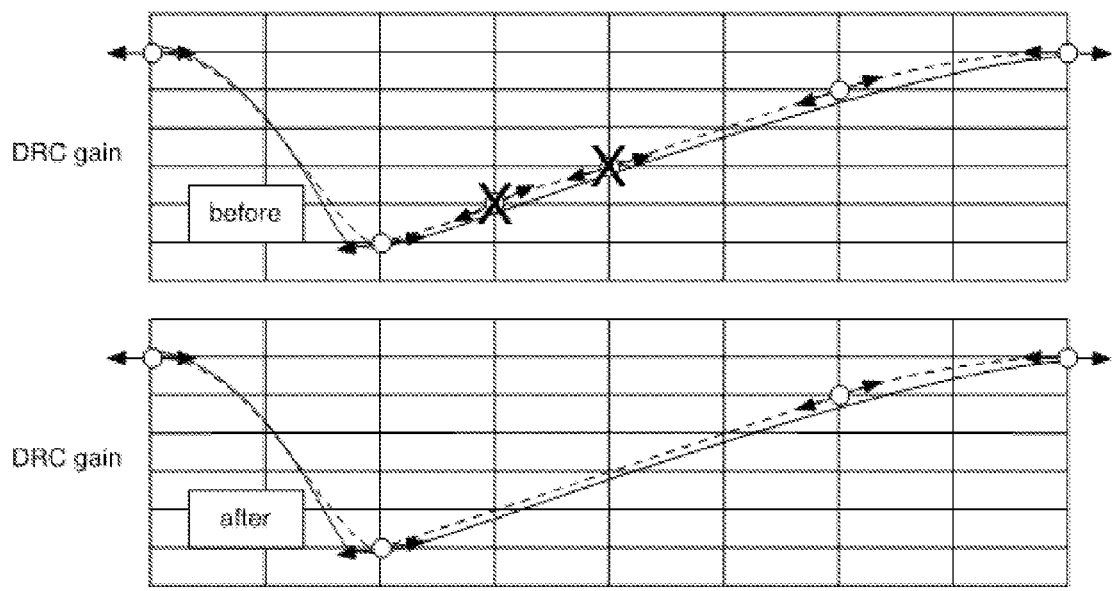
FIG. 6 shows spline modification by removing nodes on slopes if the slope is approximately constant according to one embodiment.
Figure 7:
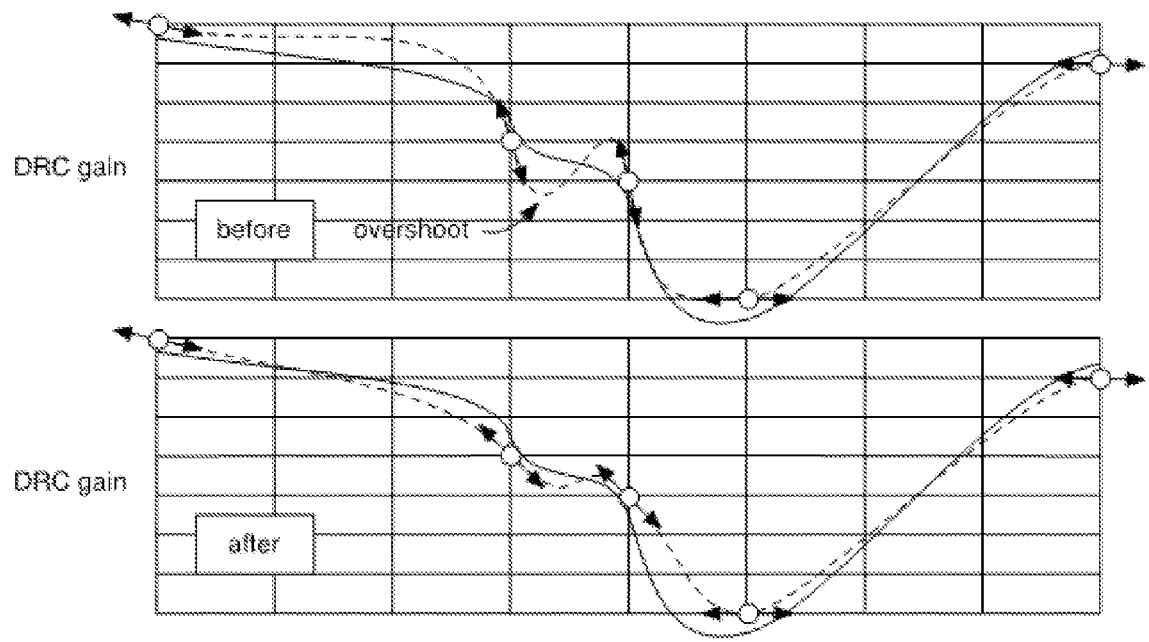
FIG. 7 shows spline modification to avoid overshoots according to one embodiment.

The existing nodes may be evaluated at operation 909 and modified or removed depending on the following rules:

Remove the middle node if three consecutive nodes have identical gain (see FIG. 2).
  Remove one middle node of four nodes if the two middle nodes have the same gain value and the four nodes are on an ascending or descending slope (see FIG. 3).
  Set the slope steepness to zero for local maxima and minima of the gain (see FIG. 4).
  Set the slope steepness to zero if neighboring quantized gain values are the same (see FIG. 5).
  Remove nodes on slopes if the slope is approximately constant (see FIG. 6).
  Avoid overshoots: make steep slopes shallower if there is an overshoot. Overshoots can be detected by computing the locations where the first derivative of the spline is zero. The gain at these locations can be computed and compared to the gain values at the nodes. An overshoot is given when the gain exceeds the maximum gain of the two spline nodes by a certain factor, or if the gain is below the minimum of the two spline node gains by a certain factor. For a cubic spline, there can be up to two locations with a derivative of zero if at least one slope is nonzero (see FIG. 7).

As explained above, the method 900 produces an optimized spline representation, which minimizes bit rate and approximation error. In particular, by using a heuristics approach to select and modify spline nodes for placement in a DRC representation, the method 900 is able to generate a set of spline nodes that accurately represent a corresponding audio signal with a reduced complexity in comparison to a brute force approach as described above.

In one embodiment, the DRC gain representation, which includes the DRC spline nodes generated above, may be transmitted or otherwise delivered to one or more audio playback devices 809 at operation 911. For example, the DRC spline nodes may be transmitted along with other pieces of data representing a corresponding audio signal, to one or more of the audio playback devices 809 via the interface 807 and the switching fabric 811. However, in other embodiments, the DRC spline nodes may be transmitted to the audio playback devices 809 using any other medium. The audio playback devices 809 may utilize these DRC spline nodes to decode/generate a set of DRC gain values for playback a corresponding piece of sound program content.

Several example embodiments will not be described based on the description provided above. In one embodiment, an article of manufacture for selecting spline nodes for Dynamic Range Control (DRC) gain values, comprises: a non-transitory machine-readable storage medium that stores instructions which, when executed by a processor in a computer, quantize DRC gain values for a frame of a corresponding audio signal; place one or more spline nodes in a spline representation of the DRC gain values based on the quantized DRC gain values or the DRC gain values; and modify the one or more spline nodes in the spline representation to reduce overshoots and remove redundancies.

In one embodiment, each of the spline nodes is represented by a gain value, a time value indicating when the corresponding gain value is applied in the frame, and a slope value.

In one embodiment the non-transitory machine-readable storage medium stores further instructions for placing the one or more spline nodes which, when executed by the processor: place a spline node at a location in the spline representation corresponding to a change in gain between neighboring quantized DRC gain values.

In one embodiment, the non-transitory machine-readable storage medium stores further instructions for placing the one or more spline nodes which, when executed by the processor: determine quantization error values for the quantized DRC gain values in comparison to the received DRC gain values; and when two neighboring quantized DRC gain values have the same gain value, place a spline node at a location in the spline representation corresponding to the quantized DRC gain value of the two neighboring quantized DRC gain values with the lowest quantization error.

In one embodiment, the non-transitory machine-readable storage medium stores further instructions for placing the one or more spline nodes which, when executed by the processor: place a spline node in the center of the spline representation with a gain value of a corresponding quantized DRC gain value when after attempting to place spline nodes in the spline representation based on 1) change in gain between neighboring quantized DRC gain values and 2) quantization error values of two identical neighboring quantized DRC gain values no spline nodes have been placed in the spline representation.

In one embodiment, the non-transitory machine-readable storage medium includes further instructions which, when executed by the processor: quantize the spline nodes placed in the time representation of the frame in terms of time values and gain values; and insert spline nodes in the spline representation of the frame to reduce approximation errors when the quantization error is above a predefined error value for one or more quantized DRC gain values with slopes above a predefined slope value.

In one embodiment, the non-transitory machine-readable storage medium stores further instructions for modifying the one or more spline nodes which, when executed by the processor: remove a middle spline node when three neighboring spline nodes in the spline representation have identical gain values.

In one embodiment, the non-transitory machine-readable storage medium stores further instructions for modifying the one or more spline nodes which, when executed by the processor: remove, in a set of four neighboring spline nodes in the spline representation with two outer spline nodes and two middle spline nodes, one of the middle spline nodes when both middle spline nodes have identical gain values and the set of four neighboring spline nodes are collectively on an ascending or descending slope.

In one embodiment, the non-transitory machine-readable storage medium stores further instructions for modifying the one or more spline nodes which, when executed by the processor: set the slope steepness for spline nodes at local maxima and local minima in the spline representation to zero.

In one embodiment, the non-transitory machine-readable storage medium stores further instructions for modifying the one or more spline nodes which, when executed by the processor: set the slope steepness for neighboring spline nodes with identical gain values in the spline representation to zero.

In one embodiment, the non-transitory machine-readable storage medium stores further instructions for modifying the one or more spline nodes which, when executed by the processor: remove, in a set of three or more neighboring spline nodes, one or more spline nodes from the set of three or more neighboring spline nodes, when the slope values for the three or more spline nodes are within a predefined variance level.

In one embodiment, the non-transitory machine-readable storage medium stores further instructions for modifying the one or more spline nodes which, when executed by the processor: compute the first derivative for a segment of a spline in the spline representation, wherein the segment of the spline is positioned between two spline nodes; determine the gain value for the segment of the spline when the first derivative for the segment of the spline is zero; detect an overshoot by the segment of the spline when the gain value for the segment of the spline is 1) above the maximum gain value of the two spline nodes by a predefined factor or 2) below the minimum gain value of the two spline nodes by the predefined factor; and adjust the slope values for the two spline nodes to make the slope values for the two spline nodes shallower in response to detecting an overshoot for the segment of the spline.

In one embodiment, the non-transitory machine-readable storage medium includes further instructions which, when executed by the processor: smooth the DRC gain values prior to quantizing the DRC gain values such that fast gain changes are eliminated.

In one embodiment, a system for selecting spline nodes for Dynamic Range Control (DRC) gain values, comprises: a device, including a hardware processor, the device being configured to: quantize DRC gain values for a frame corresponding to an audio signal; place one or more spline nodes in a spline representation of the DRC gain values based on the quantized DRC gain values or the DRC gain values; and modify the one or more spline nodes in the spline representation to reduce overshoots and remove redundancies.

In one embodiment, each of the spline nodes is represented by a gain value, a time value indicating when the corresponding gain value is applied in the frame, and a slope value.

In one embodiment, the device is further configured to: place a spline node at a location in the spline representation corresponding to a change in gain between neighboring quantized DRC gain values.

In one embodiment, the device is further configured to: determine quantization error values for the quantized DRC gain values in comparison to the received DRC gain values; and when two neighboring quantized DRC gain values have the same gain value, place a spline node at a location in the spline representation corresponding to the quantized DRC gain value of the two neighboring quantized DRC gain values with the lowest quantization error.

In one embodiment, the device is further configured to: place a spline node in the center of the spline representation with a gain value of a corresponding quantized DRC gain value when after attempting to place spline nodes in the spline representation based on 1) change in gain between neighboring quantized DRC gain values and 2) quantization error values of two identical neighboring quantized DRC gain values no spline nodes have been placed in the spline representation.

In one embodiment, the device is further configured to: quantize the spline nodes placed in the time representation of the frame in terms of time values and gain values; and insert spline nodes in the spline representation of the frame to reduce approximation errors when the quantization error is above a predefined error value for one or more quantized DRC gain values with slopes above a predefined slope value.

In one embodiment, the device is further configured to: remove a middle spline node when three neighboring spline nodes in the spline representation have identical gain values.

In one embodiment, the device is further configured to: remove, in a set of four neighboring spline nodes in the spline representation with two outer spline nodes and two middle spline nodes, one of the middle spline nodes when both middle spline nodes have identical gain values and the set of four neighboring spline nodes are collectively on an ascending or descending slope.

In one embodiment, the device is further configured to: set the slope steepness for spline nodes at local maxima and local minima in the spline representation to zero.

In one embodiment, the device is further configured to: set the slope steepness for neighboring spline nodes with identical gain values in the spline representation to zero.

In one embodiment, the device is further configured to: remove, in a set of three or more neighboring spline nodes, one or more spline nodes from the set of three or more neighboring spline nodes, when the slope values for the three or more spline nodes are within a predefined variance level.

In one embodiment, the device is further configured to: compute the first derivative for a segment of a spline in the spline representation, wherein the segment of the spline is positioned between two spline nodes; determine the gain value for the segment of the spline when the first derivative for the segment of the spline is zero; detect an overshoot by the segment of the spline when the gain value for the segment of the spline is 1) above the maximum gain value of the two spline nodes by a predefined factor or 2) below the minimum gain value of the two spline nodes by the predefined factor; and adjust the slope values for the two spline nodes to make the slope values for the two spline nodes shallower in response to detecting an overshoot for the segment of the spline.

In one embodiment, the device is further configured to: smooth the DRC gain values prior to quantizing the DRC gain values such that fast gain changes are eliminated.

As explained above, an embodiment of the invention may be a machine-readable medium such as one or more solid state memory devices having stored thereon instructions which program one or more data processing components (generically referred to here as "a processor" or a "computer system") to perform some of the operations described above. In other embodiments, some of these operations might be performed by specific hardware components that contain hardwired logic. Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method for selecting spline nodes for Dynamic Range Control (DRC) gain values, comprising:
   receiving DRC gain values corresponding to an audio signal;
   quantizing the DRC gain values for a frame of the audio signal;
   placing one or more spline nodes in a spline representation of the DRC gain values based on the quantized DRC gain values or the DRC gain values; and
   modifying the one or more spline nodes in the spline representation to reduce overshoots and remove redundancies.

2. The method of claim 1, wherein each of the spline nodes is represented by a gain value, a time value indicating when the corresponding gain value is applied in the frame, and a slope value.

3. The method of claim 2, wherein placing the one or more spline nodes comprises:
   placing a spline node at a location in the spline representation corresponding to a change in gain between neighboring quantized DRC gain values.

4. The method of claim 3, wherein placing the one or more spline nodes further comprises:
   determining quantization error values for the quantized DRC gain values in comparison to the received DRC gain values; and
   when two neighboring quantized DRC gain values have the same gain value, placing a spline node at a location in the spline representation corresponding to the quantized DRC gain value of the two neighboring quantized DRC gain values with the lowest quantization error.

5. The method of claim 4, wherein placing the one or more spline nodes further comprises:
   placing a spline node in the center of the spline representation with a gain value of a corresponding quantized DRC gain value when after attempting to place spline nodes in the spline representation based on 1) change in gain between neighboring quantized DRC gain values and 2) quantization error values of two identical neighboring quantized DRC gain values no spline nodes have been placed in the spline representation.

6. The method of claim 5, further comprising:
   quantizing the spline nodes placed in the time representation of the frame in terms of time values and gain values; and
   inserting spline nodes in the spline representation of the frame to reduce approximation errors when the quantization error is above a predefined error value for one or more quantized DRC gain values with slopes above a predefined slope value.

7. The method of claim 2, wherein modifying the one or more spline nodes comprises:
   removing a middle spline node when three neighboring spline nodes in the spline representation have identical gain values.

8. The method of claim 2, wherein modifying the one or more spline nodes comprises:
   removing, in a set of four neighboring spline nodes in the spline representation with two outer spline nodes and two middle spline nodes, one of the middle spline nodes when both middle spline nodes have identical gain values and the set of four neighboring spline nodes are collectively on an ascending or descending slope.

9. The method of claim 2, wherein modifying the one or more spline nodes comprises:
   setting the slope steepness for spline nodes at local maxima and local minima in the spline representation to zero.

10. The method of claim 2, wherein modifying the one or more spline nodes comprises:
    setting the slope steepness for neighboring spline nodes with identical gain values in the spline representation to zero.

11. The method of claim 2, wherein modifying the one or more spline nodes comprises:
    removing, in a set of three or more neighboring spline nodes, one or more spline nodes from the set of three or more neighboring spline nodes, when the slope values for the three or more spline nodes are within a predefined variance level.

12. The method of claim 2, wherein modifying the one or more spline nodes comprises:
    computing the first derivative for a segment of a spline in the spline representation, wherein the segment of the spline is positioned between two spline nodes;

determining the gain value for the segment of the spline when the first derivative for the segment of the spline is zero;

detecting an overshoot by the segment of the spline when the gain value for the segment of the spline is 1) above the maximum gain value of the two spline nodes by a predefined factor or 2) below the minimum gain value of the two spline nodes by the predefined factor; and adjusting the slope values for the two spline nodes to make the slope values for the two spline nodes shallower in response to detecting an overshoot for the segment of the spline.

13. The method of claim 1, further comprising:
smoothing the DRC gain values prior to quantizing the DRC gain values such that fast gain changes are eliminated.

14. An article of manufacture for selecting spline nodes for Dynamic Range Control (DRC) gain values, comprising:
a non-transitory machine-readable storage medium that stores instructions which, when executed by a processor in a computer,
quantize DRC gain values for a frame of a corresponding audio signal;
place one or more spline nodes in a spline representation of the DRC gain values based on the quantized DRC gain values or the DRC gain values; and
modify the one or more spline nodes in the spline representation to reduce overshoots and remove redundancies.

15. The article of manufacture of claim 14, wherein each of the spline nodes is represented by a gain value, a time value indicating when the corresponding gain value is applied in the frame, and a slope value.

16. The article of manufacture of claim 15, wherein the non-transitory machine-readable storage medium stores further instructions for placing the one or more spline nodes which, when executed by the processor:
place a spline node at a location in the spline representation corresponding to a change in gain between neighboring quantized DRC gain values.

17. The article of manufacture of claim 16, wherein the non-transitory machine-readable storage medium stores further instructions for placing the one or more spline nodes which, when executed by the processor:
determine quantization error values for the quantized DRC gain values in comparison to the received DRC gain values; and
when two neighboring quantized DRC gain values have the same gain value, place a spline node at a location in the spline representation corresponding to the quantized DRC gain value of the two neighboring quantized DRC gain values with the lowest quantization error.

18. The article of manufacture of claim 17, wherein the non-transitory machine-readable storage medium stores further instructions for placing the one or more spline nodes which, when executed by the processor:
place a spline node in the center of the spline representation with a gain value of a corresponding quantized DRC gain value when after attempting to place spline nodes in the spline representation based on 1) change in gain between neighboring quantized DRC gain values and 2) quantization error values of two identical neighboring quantized DRC gain values no spline nodes have been placed in the spline representation.

19. The article of manufacture of claim 18, wherein the non-transitory machine-readable storage medium includes further instructions which, when executed by the processor:
quantize the spline nodes placed in the time representation of the frame in terms of time values and gain values; and
insert spline nodes in the spline representation of the frame to reduce approximation errors when the quantization error is above a predefined error value for one or more quantized DRC gain values with slopes above a predefined slope value.

20. A system for selecting spline nodes for Dynamic Range Control (DRC) gain values, comprising:
a device, including a hardware processor, the device being configured to:
quantize DRC gain values for a frame corresponding to an audio signal;
place one or more spline nodes in a spline representation of the DRC gain values based on the quantized DRC gain values or the DRC gain values; and
modify the one or more spline nodes in the spline representation to reduce overshoots and remove redundancies.

21. The system of claim 20, wherein each of the spline nodes is represented by a gain value, a time value indicating when the corresponding gain value is applied in the frame, and a slope value.

22. The system of claim 21, wherein the device is further configured to:
place a spline node at a location in the spline representation corresponding to a change in gain between neighboring quantized DRC gain values.

23. The system of claim 22, wherein the device is further configured to:
determine quantization error values for the quantized DRC gain values in comparison to the received DRC gain values; and
when two neighboring quantized DRC gain values have the same gain value, place a spline node at a location in the spline representation corresponding to the quantized DRC gain value of the two neighboring quantized DRC gain values with the lowest quantization error.

24. The system of claim 23, wherein the device is further configured to:
place a spline node in the center of the spline representation with a gain value of a corresponding quantized DRC gain value when after attempting to place spline nodes in the spline representation based on 1) change in gain between neighboring quantized DRC gain values and 2) quantization error values of two identical neighboring quantized DRC gain values no spline nodes have been placed in the spline representation.

25. The system of claim 24, wherein the device is further configured to:
quantize the spline nodes placed in the time representation of the frame in terms of time values and gain values; and
insert spline nodes in the spline representation of the frame to reduce approximation errors when the quantization error is above a predefined error value for one or more quantized DRC gain values with slopes above a predefined slope value.

* * * * *